United States Patent [19]
Hofmeister et al.

[11] Patent Number: 5,954,472
[45] Date of Patent: *Sep. 21, 1999

[54] BATCH LOADER ARM

[75] Inventors: Christopher A. Hofmeister, Hampstead, N.H.; Christopher C. Kiley, Lincoln, Mass.

[73] Assignee: Brooks Automation, Inc., Chelmsford, Mass.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/679,845

[22] Filed: Jul. 15, 1996

[51] Int. Cl.⁶ .................................................. B66C 23/00
[52] U.S. Cl. .................... 414/744.5; 74/490.04; 901/21; 414/937
[58] Field of Search ............... 414/744.6, 744.5, 414/744.4, 744.2, 937, 786, 805–808, 810, 811; 901/21; 74/89.2, 89.22, 490.04

[56] References Cited

U.S. PATENT DOCUMENTS

| | | |
|---|---|---|
| 4,687,542 | 8/1987 | Davis et al. ........................... 156/643 |
| 4,728,252 | 3/1988 | Lada et al. ........................... 414/744.5 |
| 4,749,330 | 6/1988 | Hine ..................................... 414/744 A |
| 4,775,281 | 10/1988 | Prentakis ............................. 414/937 X |
| 4,813,845 | 3/1989 | Swain ................................... 414/744.5 |
| 4,837,650 | 6/1989 | Kawada ............................... 74/89.2 X |
| 4,897,015 | 1/1990 | Abbe et al. .......................... 414/744.8 |
| 4,951,601 | 8/1990 | Maydan et al. ......................... 118/719 |
| 5,183,370 | 2/1993 | Cruz ..................................... 414/752 X |
| 5,314,293 | 5/1994 | Carlisle et al. ....................... 901/21 X |
| 5,332,235 | 7/1994 | Poduje et al. ...................... 414/744.5 X |
| 5,333,986 | 8/1994 | Mizukami et al. ..................... 414/217 |
| 5,431,529 | 7/1995 | Eastman et al. ................... 414/744.5 |
| 5,474,410 | 12/1995 | Ozawa et al. ......................... 414/217 |
| 5,613,821 | 3/1997 | Muka et al. ........................ 414/937 X |

FOREIGN PATENT DOCUMENTS

| | | |
|---|---|---|
| 64-64232 | 3/1989 | Japan . |
| 1-157547 | 6/1989 | Japan . |

Primary Examiner—Donald W. Underwood
Attorney, Agent, or Firm—Perman & Green, LLP

[57] ABSTRACT

The invention resides in an improved transport mechanism which utilizes a linkage having a plurality of end effectors disposed at one end thereof. Movement of a drive linkage in a first rotational direction causes opposite rotation at the end effectors so that the center of the articles carried by the end effectors are moved in a straight line path as between first and second locations.

15 Claims, 6 Drawing Sheets

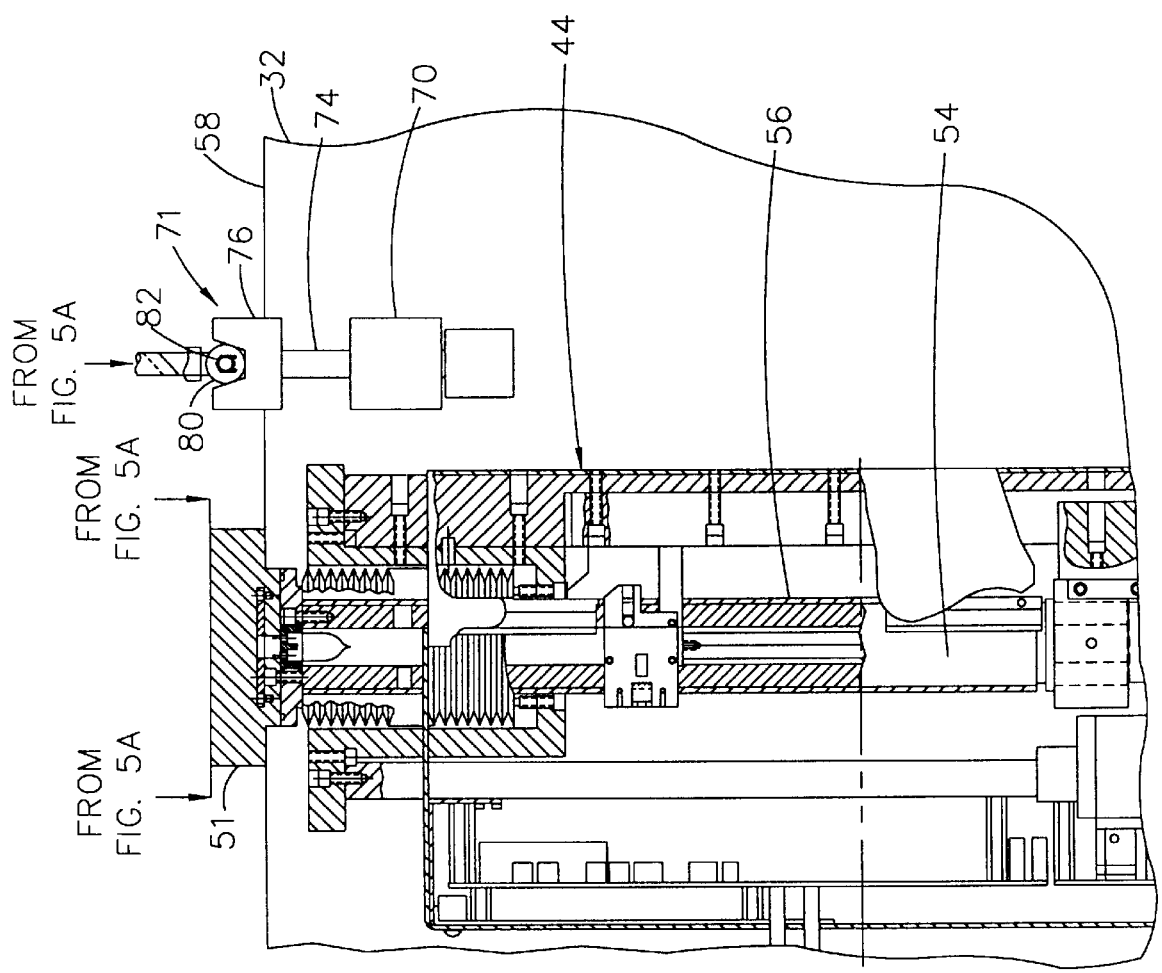

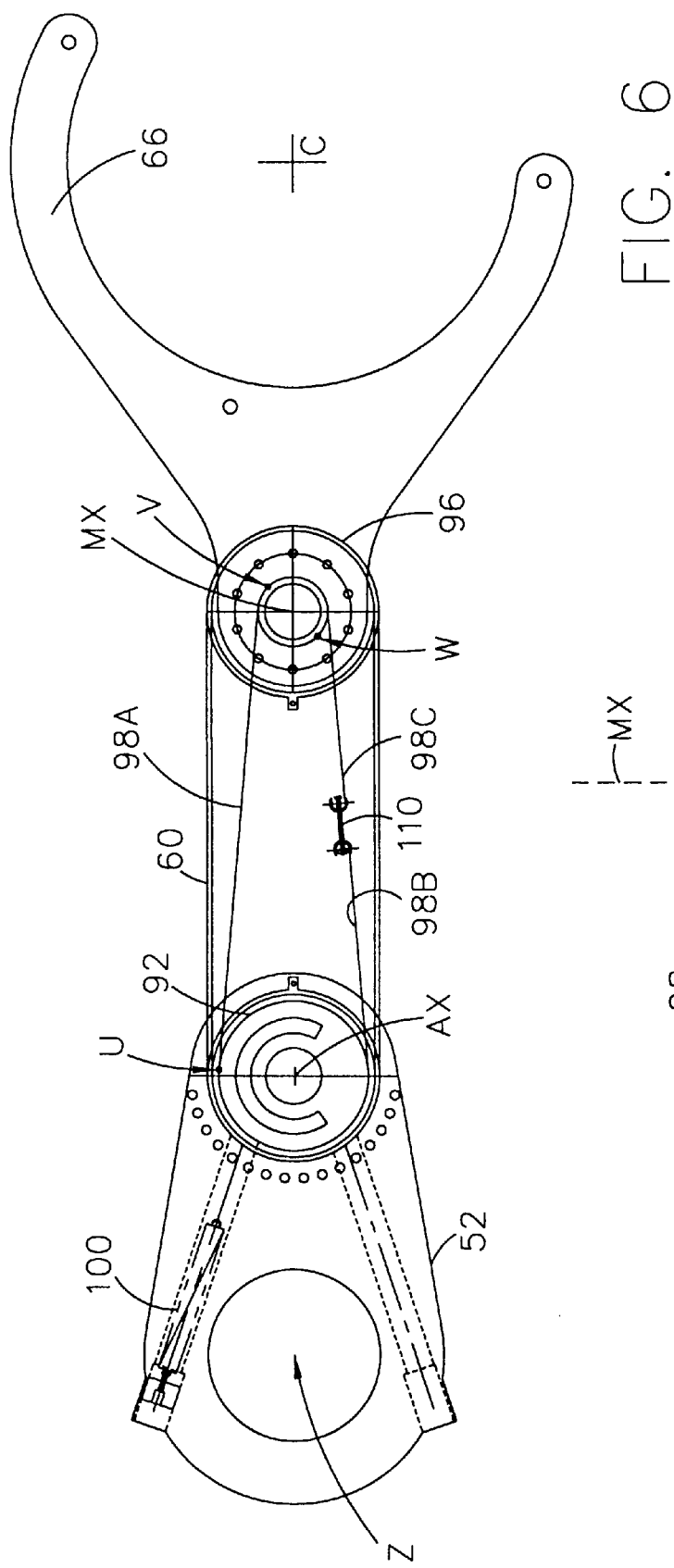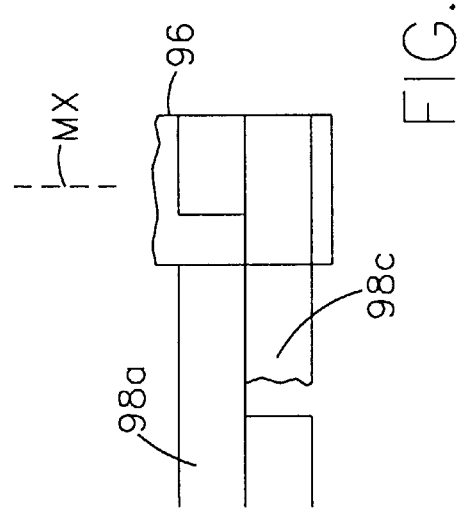

BATCH LOADER ARM

CROSS-REFERENCED TO RELATED APPLICATION

The first invention relates to copending application. Ser. No. 08/498,835 entitled "Load Arm For A Load Lock" filed in the name of Muka et al. on Jul. 6, 1995 and which application being commonly assigned with the assignee of the present invention.

FIELD OF INVENTION

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

BACKGROUND OF THE INVENTION

The present invention relates to generally material transfer devices, and in particular to material transfer devices which are used in the production of substrates which may take the form of semi-conductor wafers and or flat panels, or other substrates, or media.

The need for high throughput transport devices which can move a substrate or workpiece between remote locations within highly confined areas as defined by a limited footprint such as found in the manufacture of wafers or panels used in the semiconductor industry are in high demand. This is because in the process of manufacturing, not just in the semiconductor industry, the need to move a workpiece from one position to the next not only requires a high throughput rate, but also accuracy of repeatability of placement of workpieces in registration at predetermined orientations on a support surface. Still a further constraint is a to fabricate a positioning machine which is capable of working in a clean room environment where the existence of particulates is minimized, if not nonexistent.

Attempts have been made to fabricate placement devices which employ rotary to linear motion robotic arms which can effect straight line movement of a substrate between stations. One such arm is disclosed in U.S. Pat. No. 4,897,015. In this patent, it is disclosed to provide an end effector which is capable of carrying a substrate such as a silicon wafer from one point to another in a straight line. This is accomplished by using a series of pulleys which drivingly connect two pivot linkages about which the articulated parts travel. The dual pulley system however introduces unwanted possibilities of error by having two nonpositively connected drives control movement of the end effector, each of which drives presents a separate possibility of error through the introduction of possible belt/pulley slippage. In the device disclosed in U.S. Pat. No. 4,897,015 the slippage problem is of a furthermore problematic because of the small width belts which are used to articulate the drive mechanism.

Accordingly it is an object of the present invention to provide an article transfer mechanism for moving an article between first and second stations in a straight linear path with repeatability of movement.

It is still a further object of the invention to provide a transport device of the aforementioned type wherein a substrate is capable of being moved as a group of stacked substrates from one position to the next or to effect greater throughput of the processing operation.

It is yet a further object of the invention to provide a transport mechanism of the aforementioned type wherein the mechanism provides a holder on which is stacked a plurality of substrates which are handled as a group and worked on by subsequent operations using the holder.

Still a further object of the invention is to provide a transport mechanism which is capable of functioning in a clean room environment.

Further objects and advantages of the present invention will become apparent from the following specification and appended claims.

BRIEF DESCRIPTION OF THE DRAWINGS

FIG. 6 is a top plan view of the linkages which embody the transport mechanism.

FIG. 8 is a schematic view of the end length of the belt around the driven pulley.

SUMMARY OF THE INVENTION

An apparatus for moving an article in a straight line path between a first and a second position comprises: a base and a drive arm pivotally connected to one another about a first pivot axis. A drive means is rotatably connected to the drive arm at the first pivot axis for rotation thereabout. The drive arm has a free end which has a second pivot axis disposed parallel to the first pivot axis. The drive arm free end further includes at least one article handling element which is rotatably disposed about the second pivot axis. Means is provided for rotatably coupling the at least one article holding element to the base such that upon rotation of the drive means, the drive arm is rotated in one direction and the at least one article handling element is rotated in the other opposite direction.

DETAILED DESCRIPTION OF THE PREFERRED EMBODIMENTS

Figure 1:
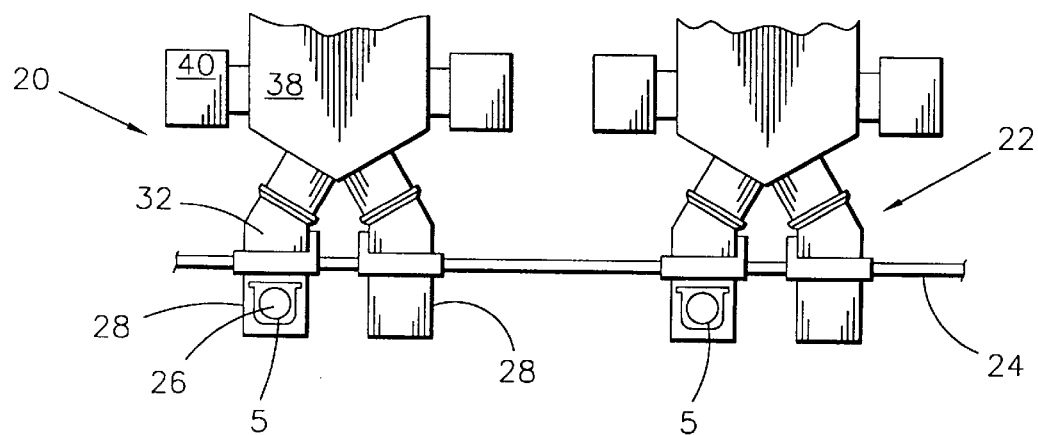
FIG. 1 is a partially fragmentary top plan diagrammatic view of a pair of side by side processing stations of the type capable of utilizing the transfer apparatus of the invention.

Turning now to the drawings, FIG. 1 illustrates a series of processing systems 20 for operating on planar substrates which may include wafers and flat panels. As noted earlier, the terms "wafer", or "substrate" will be used for purposes of consistency to refer to such substrates, but it will be understood that it is intended to be used in the broad context so as to be applicable to all substrates. The processing systems 20 may be arranged, for example, in side-by-side fashion within a "clean room" 22 separated from the outside environment by a wall 24. It may be possible to eliminate the clean room as a separate environment and, instead, maintain a desired clean environment within the system 20 and within each instrumentality which interfaces with the system.

Figure 2:
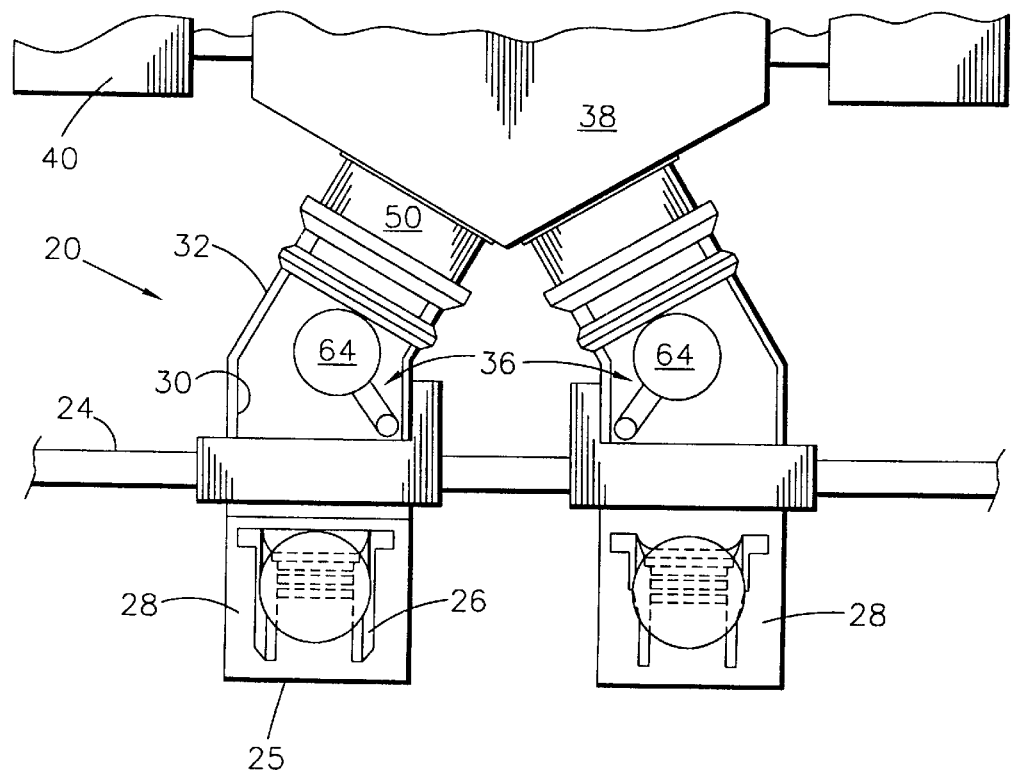
FIG. 2 is a top plan diagrammatic view illustrating, in greater detail, a single one of the processing stations of FIG. 1 and utilizing a transfer apparatus embodying the invention.
Figure 3:
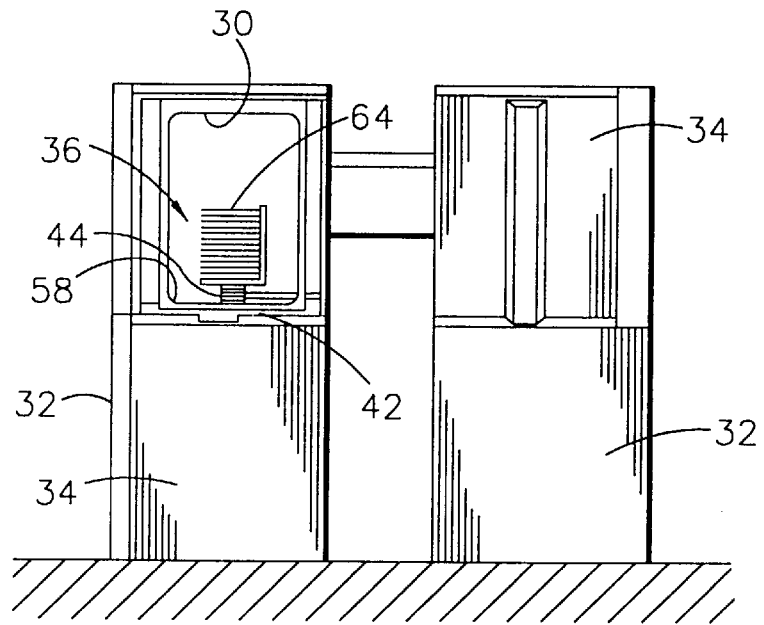
FIG. 3 is a front elevation view of the processing station illustrated in FIG. 2.
Figure 4:
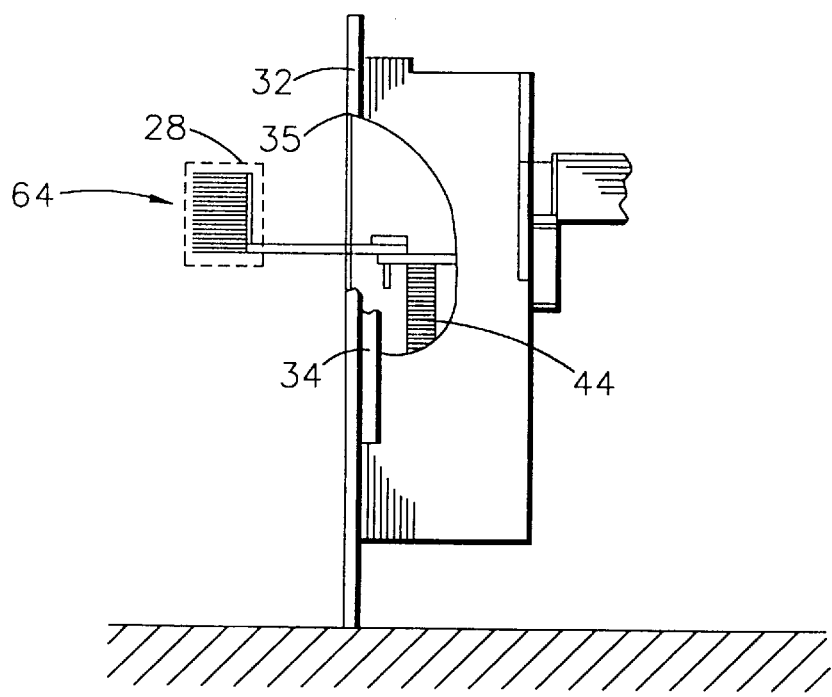
FIG. 4 is a side elevation view, certain parts being cut away for clarity, of the processing station illustrated in FIG. 3 showing the end effector of the transfer apparatus in its extended condition.

In any case, it is customary to carry a large number of substrates or workpieces 25 (FIG. 2) within a cassette 26 or within a controlled environment carrier box. In such instances, a plurality of the substrates are loaded into the cassette where each is supported in a spaced, stacked, relationship, and then transported manually, or otherwise, and placed on a shelf 28 adjacent an associated system 20 to await entry for processing. Previously, the cassette would be manually, or robotically from outside, placed into a waiting chamber 30 within a load lock 32 when an entry door 34 (FIGS. 2, 3, 4) has been opened enabling access through a load port 35 (FIG. 4). By means of a transfer apparatus 36 to be described, a plurality of the substrates 25 in the cassette 26 are lifted off the shelves of the cassette and moved in stacked form into the chamber 30 of the load lock station 32 in one motion of the apparatus 36. Subsequently, by means of another apparatus, the substrates 25 are moved one by one to a transport chamber 38 and, from there, to one or more of a plurality of processing stations 40.

Figure 5A:
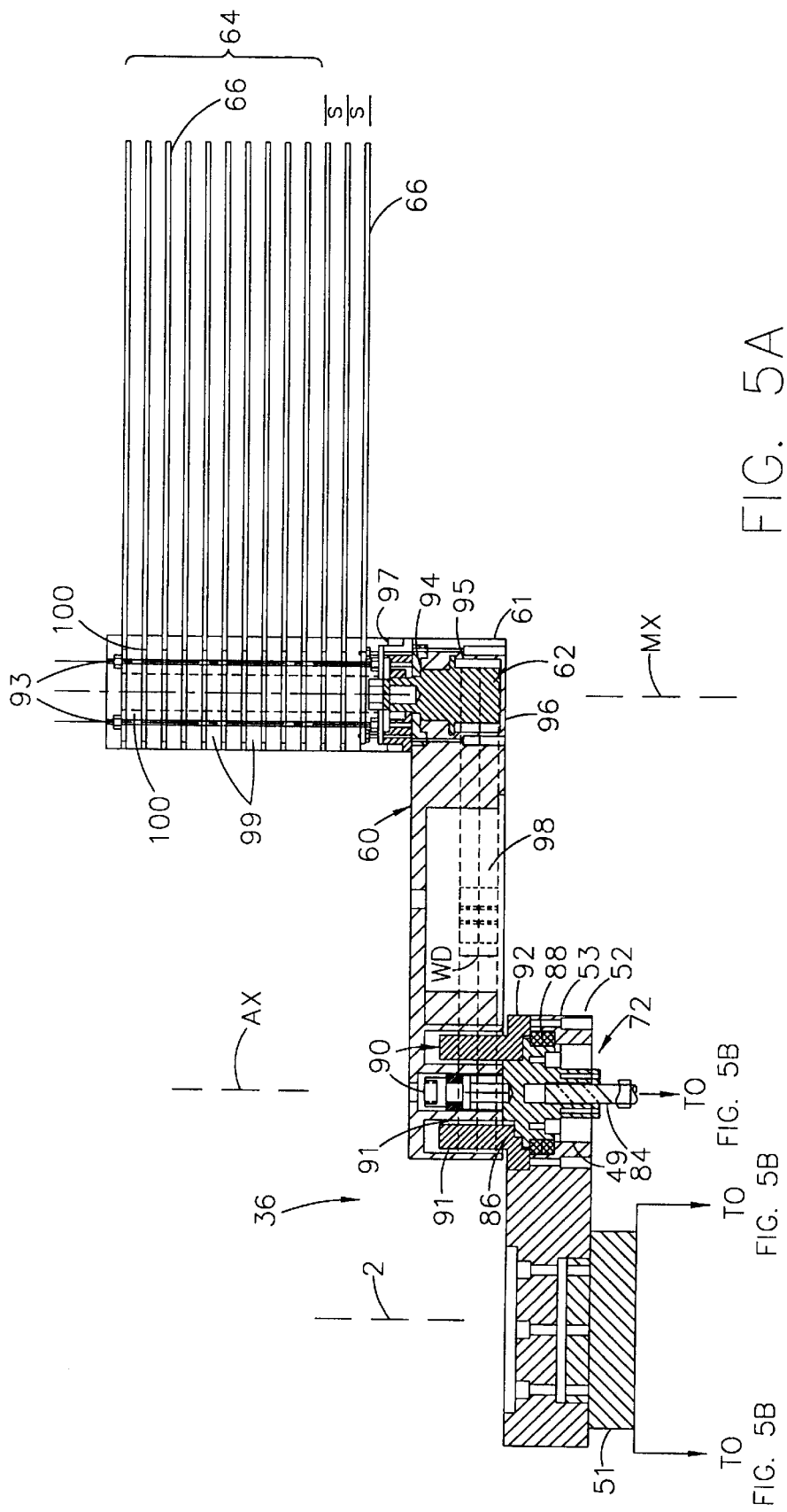
FIG. 5 is a partially fragmentary vertical sectional view through the transfer apparatus of the invention.

As illustrated in FIGS. 4 and 5, the transport apparatus 36 is mounted to the top of an elevator mechanism 44 for vertical movement along the indicated Z-axis. The elevator mechanism 44 is supported within the station 32 and controllably, selectively positions the apparatus 36 at different height locations. For this purpose, as seen in FIG. 5, the elevator mechanism 44 includes a lifting shaft 56 which is drivingly connected to a lift tube 54 responsible for moving the shaft 56 in the vertical direction along the Z-axis. At the top of the lifting shaft 56 is disposed a mounting block 51 which is secured against movement to the shaft 56 by an appropriate set of threaded bolts.

A support arm 52 is nonrotatably secured to the mounting block 51 so as to be cantilevered outwardly of the mounting block 51 in the illustrated manner shown in FIG. 5. The free end 53 of support arm 52 rotatably supports a drive arm 60 thereon for rotation about the indicted axis AX. The free end 61 of the drive arm 60 in turn supports a plurality 64 of end effectors 66 thereon which are arranged in a stacked arrangement and for rotational movement about the indicated axis Mx. Unlike the drive arm 60, the support arm 52 is stationary except for movement in the Z-axis. The drive arm 60 and the end effector plurality 64 are however moveable both angularly and linearly relative to the support arm 52.

Relative movement between the drive arm 60 and the end effector plurality 64, and between these elements taken relative to the support arm 52 is accomplished through the intermediary of a rotary actuator illustrated generally schematically at 70. The actuator 70 is secured against movement to the housing of the station 32 and has an output shaft 74 which is aligned with the rotational axis AX so as to directly rotate the drive arm 60 about the indicated axis AX through the intermediary of a drive coupling means 71. The rotary actuator 70 used in the preferred embodiment is one which is commercially available and sold by Harmonic Drive Systems of Hauppauge, N.Y.

The drive coupling means 71 includes a cradle 76 which is secured for rotation about the axis AX to the output shaft 74 of the motor 70, and includes a generally T-shaped connector 82 which depends from a shaft 84 and is drivingly connected to the drive arm 60. The shaft 84 is part of a journalling assembly 72 which is disposed within an opening 49 in the free end 53 of the support arm 52 and supports the shaft 84 for rotation about the indicated axis AX. The T-shaped depending portion of the shaft 84 is received within a cutout 80 formed in the cradle 76 having a depth sufficient to permit continued rotational coupling between the output shaft 74 and the driven shaft 84 even through limited vertical movement of the support arm 52 along the indicated Z axis.

The journalling assembly 72 further includes a boss 86 which is rotatably mounted within an annular opening in the support arm 52 and is supported therein by an annular race bearing 88. The boss 86 at the bottom end thereof is nonrotatably connected to the driven shaft 84 for concentric driving rotation about the indicated axis AX. The boss 86 at its top end is also nonrotatably connected to the juxtaposed end of the drive arm 60 through the intermediary of a securement nut 90. Thus, with the rotation of the rotary actuator 70 about the axis AX, the shaft 84 is driven in rotation to in turn rotate the drive arm 60 in a one-to-one angular relationship with respect to the rotation of the output shaft 74.

A smooth surface cylindrical primary pulley 92 is nonrotatably mounted on the free end of the support arm 52 concentrically about the rotational axis AX and concentrically about the boss 86. The primary pulley 92 is spaced from the confronting surfaces of the drive arm 60 by gaps 91 which prevent frictional interference between these two relatively moving parts.

At the free end 61 of the drive arm 60 is journalled a mounting shaft 62 which is supported thereby and is disposed for rotational movement about the indicated axis MX. The mounting shaft 62 is journalled within a bearing assembly 94 which is mounted within an opening 95 formed in the free end of the drive arm 60. The mounting shaft 62 has a top plate 97 nonrotatably secured to it and onto which are mounted the end effectors 66 in a uniform spaced arrangement.

Each end effector includes an end block 99 which spaces it from the other so as to form a stacked arrangement thereof as defined by spacings S,S. Each end effector end block further has paired openings 100,100 which are aligned with like openings in the juxtaposed ones of the neighboring end effectors and are adapted to receive an elongated threaded member 93,93 therewithin. Each threaded member 93,93 at the lower end thereof is press fit into the top plate 97 and at each upper end thereof is secured by a locking nut in the illustrated manner. It is noted that the spacings S,S are sufficient to permit a substrate 25 to be received within the spacing between juxtaposed end effectors 66 while also allowing a tool, such as a plate-like lifting arm, to be slid therebetween.

The bottom end of the mounting shaft 62 defines a smooth surface cylindrical driven pulley 96 which responds to movements generated at the base pulley 92. The drive and the driven pulleys 92 and 96 are drivingly coupled to one another through the intermediary of a thin sheet metal band 98 having a width WD which almost completely covers the effective driving and driven surfaces of the base and driven pulleys 92 and 96. As will be discussed later in greater detail, it should be understood that the diameter of the base pulley 92 is twice that of the driven pulley 96.

Also, it should be understood that the band 98 is actually made up of three effective segments as defined by reference numerals 98a, 98b and 98c. The ends of the segment 98a are fixed respectively to the surface of the base and driven pulleys 92 and 96 at points U and V respectively. One end of segment 98b is also fixed to the base pulley 92 at point U so as to be co-terminal with the segment 98a. One end of the segment 98c is fixed to the surface of the driven pulley 96 at point W. The remaining free ends of the segments 98b and 98c are connected to one another by a tensioner 110. The use of a sheet metal band having a width WD of considerable dimension is beneficial for the purpose increasing stiffness. Also, the use of a sheet metal band of a thickness, for example of 1", allows for the band to be cut half way across its width and still maintain its stiffness. This is particularly useful in the case of the segments 98a and 98c, where the end lengths thereof, as shown in FIG. 8, are cut in half so that each length having a cut width is positioned side by side with the other and shares a portion of the surface of the driven pulley 96 and effects anchoring at different angular positions thereon.

Figure 7:
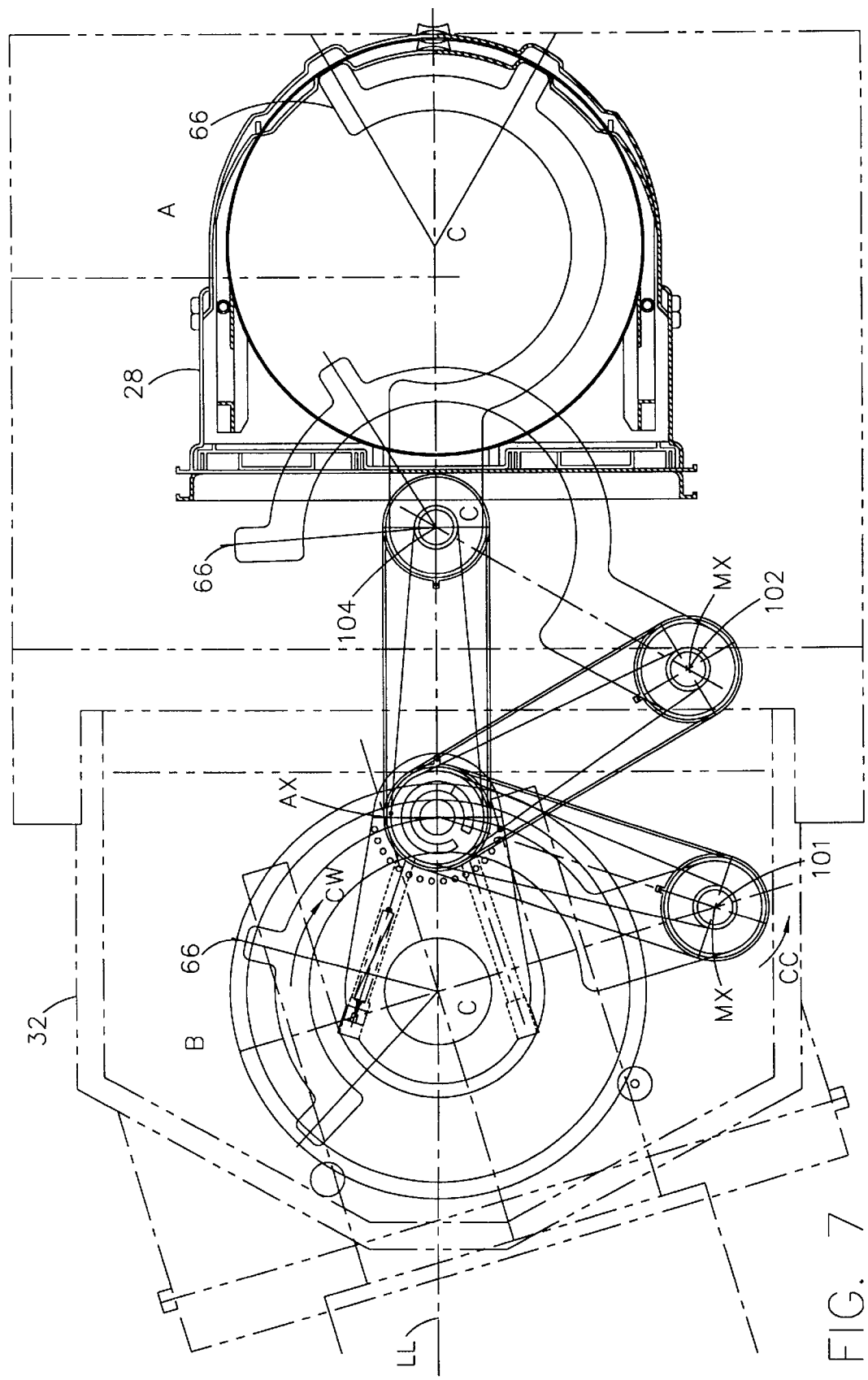
FIG. 7 is a top plan view illustrating in phantom line the various orientations of the linkages as the apparatus is articulated between extended and retracted positions.

As illustrated in FIGS. 6 and 7, the drive arm 60 is further connected to the support arm 52 through the intermediary of a retraction spring 100. The retraction spring 100, as best illustrated in FIG. 7, is provided for the purpose of biasing the drive arm 60 to a retracted position, such as illustrated in FIG. 7 in the condition illustrated by the position of reference axis MX being located at location 101.

In operation, the transport apparatus 36 is capable of moving the center(s) c of the plurality of stacked substrates 25 (or even a single substrate) along a pure straight linear path as illustrated by the positions A–B in FIG. 7. The locations A–B are connected by the linear straight line LL which identifies the path followed by the substrate 25 as between the cassette 28 (location A) and the internal confines of the locking station 32 (location B).

By following the movement of the axis MX, the articulation of the drive arm 60 relative to the end effector plurality 64 may be understood. In the retracted condition, the axis MX assumes the 10 o'clock position 101 corresponding to where the end effector plurality 64 is housed within the loading station 32 in the illustrated manner. By rotating output shaft 74 of the rotary actuator 70 counterclockwise, the drive arm 60 is caused to move from the 10 o'clock position illustrated in FIG. 7 to the 8 o'clock position corresponding generally to the intermediate positioning of the MX axis at location 102.

In so rotating the drive arm 60 from locations 101 to 102, the effect on the end effectors 66 is that the mounting shaft 62 is rotated in an opposite clockwise direction CW. Since the diameter of the base pulley 92 is on the order of twice that of the driven pulley 96, the translation of the rotary movement to the end effectors 66,66 causes the center C of the substrate 25 to be moved along a straight line path LL to the extended position illustrated by the location number 104. Throughout the rotation of the drive arm 60 in the clockwise direction, a corresponding opposite rotation is effected at the mounting shaft 62 and at a value of twice the rotation of the drive arm 60. In this way, the center C of the substrate 25, while being rotated, is nevertheless moved in a linear path along the line of action LL.

The retraction of the drive arm and end effector plurality is accomplished through the reverse of the aforesaid process whereby the rotary actuator 70 instead of turning in the counterclockwise direction is caused to be rotated in a clockwise direction to affect the retraction of the drive arm back to the location designated by the numeral 101.

It should also be appreciated that the use of a stacked arrangement of end effectors 66,66 allows the system to use the transport apparatus 36 as a platform on which subsequent operations can be performed on the substrates carried thereby in a one-by-one manner at the station 38. That is, in the past it was required that the entire cassette 28 be moved from point A in FIG. 7 to point B, and then to rely upon either a tool in the station 38 to move vertically between the various shelves in the cassette, or to move the cassette vertically relative to the station 38 in order to work on the substrates 25 in a one by one manner for subsequent operation. By the present invention however, the step of moving the cassette 28 from point A to point B is eliminated, with the result being greater throughput and efficiency of use.

By the foregoing an improved transport apparatus has been described by way of a preferred embodiments. However numerous modifications and substitutions without departing from the spirit of the invention. In particular, the invention is described with reference to counterclockwise/clockwise, vertical, horizontal and other angular labelling. However, such labels are used only for purposes of explanation, and are not to be taken to limit the scope of the invention to these orientations.

Accordingly, the invention has been described by way of illustration rather than limitation.

What is claimed is:

1. An apparatus comprising:
    a base and a drive arm pivotally connected to one another about a first pivot axis;
    a drive means rotatably connected to said drive arm at said first pivot axis for rotation thereabout;
    said drive arm having a free end which has a second pivot axis disposed parallel to the first pivot axis;
    said drive arm free end further including at least one article handling element which is rotatably disposed about said second pivot axis; and
    means for rotatably coupling said at least one article handling element to said base such that upon rotation of said drive means, said drive arm is rotated in one direction and said at least one article handling element is rotated in the other opposite direction and wherein said means for rotatably coupling includes a belt loop comprised of a plurality of sections, at least two sections having a reduced width effecting shared connection at anchorings at different angular locations about one of said first and second pivot axes.

2. An apparatus as defined in claim 1 further characterized in that said base provides a journalling means on which said drive arm is rotatably supported.

3. An apparatus as defined in claim 2 further characterized in that said journalling means includes a boss rotatably mounted about said first pivot axis, said boss rotatably coupling said drive arm to said drive means such that the drive arm rotates in the same direction as the output of said drive means.

4. An apparatus as defined in claim 3 further characterized by said journalling means further includes a base pulley which is fixed relative to said base.

5. An apparatus as defined in claim 4 further characterized in that said free end of said drive arm further includes a driven pulley disposed in line with said base pulley and connected through the intermediary of said belt loop.

6. An apparatus as defined in claim 5 further characterized in that the diameter of the base pulley is twice the diameter of the driven pulley.

7. An apparatus as defined in claim 6 further characterized in that said at least one article handling element includes a plurality of article handling elements arranged in a stacked arrangement and supported uniformly in a spaced relationship to one another on a mounting shaft.

8. An apparatus as defined in claim 7 further characterized in that said mounting shaft includes a top plate on which is secured said plurality of article handling elements.

9. An apparatus as defined in claim 8 further characterized in that said drive means connects to said boss through the intermediary of a vertically compliant rotational coupling means, a vertical drive means connected to said arm for vertically moving said arm and part of said vertically compliant rotational coupling means such that said vertically compliant rotational coupling means rotatatably drives said boss at varying height locations.

10. An apparatus as defined in claim 9 further characterized in that said vertically compliant rotational coupling means includes a cradle member which is nonrotatably connected to the output shaft of a drive motor making up the drive means and a T-shaped projection depending from said boss and being adjustably movably connected to said cradle.

11. A batchloader comprising:
  a base arm structure having a first end and an opposite second end, said first end being secured against movement to a support stand and said second end housing a journalling means pivotally rotating a drive arm thereon about a first axis of rotation;
  a drive means located coincidentally with said first axis of rotation for drivingly rotating the drive arm through said base arm in either rotational directions; said drive arm having another end mounting a plurality of end effectors in a stacked arrangement for rotation about a second rotational axis;
  said plurality of end effectors being rotatably connected relative to said base arm by a base pulley located generally at said second end of said base arm and through the intermediary of a metal belt which loops thereabout, said base pulley connects to a driven pulley drivingly connected to said plurality of end effectors and base pulley is stationary relative to said support stand with the diameter of one of said base pulley and drive pulley being twice that of the other such that rotation of said drive means in a first direction causes a counter rotation of twice the angular displacement at the second pivot axis of the end effector plurality, and wherein said metal belt being comprised of a plurality of sections, at least two sections having a reduced width effecting shared connection at anchorings disposed at different angular locations about one of said base arm structure and said driven pulley.

12. A batchloader device as defined in claim 11 further characterized in that said base arm is supported on said support stand which is connected to a vertically movable elevator mechanism movable between different horizontal planes.

13. A batchloader as defined in claim 11 further characterized by a vertically compliant rotational coupling means connected between said drive means and said drive arm for rotatatably driving said drive arm with said drive means and a vertical drive means for vertically moving said drive arm and part of said vertically compliant rotational coupling means such that said vertically compliant rotational coupling mean is driven at varying height locations corresponding with different horizontal planes.

14. A batchloader as defined in claim 11 further characterized in that said base pulley connects to a driven pulley drivingly connected to said plurality of end effectors and said base pulley is stationary relative to said support stand.

15. A batchloader comprising:
  a base arm having a first end and an opposite second end, said first end being secured against movement to a support stand and said second end housing a journalling means pivotally rotating a drive arm having one end mounted thereon about a first axis rotation;
  a drive means located coincidentally with said first axis of rotation for drivingly rotating the drive arm through said support arm in either rotational directions;
  said drive arm having another end mounting a plurality of end effectors in a stacked arrangement for rotation about a second rotational axis;
  said plurality of end effectors being rotatably connected relative to said base arm by a base pulley located generally at said second end of said base arm and through the intermediary of a metal belt which loops thereabout, said base pulley connects to a driven pulley drivingly connected to said plurality of end effectors and base pulley is stationary relative to said support stand with the diameter of one of said base pulley and drive pulley being twice that of the other such that rotation of said drive means in a first direction causes a counter rotation of twice the angular displacement at the second pivot axis of the end effector plurality; and
  wherein said metal belt being comprised of a plurality of sections, at least two sections having a reduced width effecting shared connection about the driven pulley at different angular locations.

\* \* \* \* \*